United States Patent
Ito

(10) Patent No.: US 8,714,839 B2
(45) Date of Patent: May 6, 2014

(54) RECEPTACLE CAGE, RECEPTACLE ASSEMBLY, AND TRANSCEIVER MODULE ASSEMBLY

(75) Inventor: Toshiyasu Ito, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 58 days.

(21) Appl. No.: 13/595,422

(22) Filed: Aug. 27, 2012

(65) Prior Publication Data

US 2013/0051738 A1    Feb. 28, 2013

(30) Foreign Application Priority Data

Aug. 31, 2011    (JP) ................................. 2011-188604

(51) Int. Cl.
*G02B 6/36*   (2006.01)
*G02B 6/00*   (2006.01)
*H04B 10/00*  (2013.01)
*G02B 6/42*   (2006.01)

(52) U.S. Cl.
CPC ............ *G02B 6/4292* (2013.01); *G02B 6/4246* (2013.01); *H04B 10/00* (2013.01)
USPC ................ 385/92; 385/88; 385/139; 398/135

(58) Field of Classification Search
CPC ...... G02B 6/4292; G02B 6/4246; G02B 6/42; G02B 6/4201; G02B 6/43; H04B 10/40
USPC ....................... 385/88–92, 139; 398/135–139
See application file for complete search history.

(56) References Cited

U.S. PATENT DOCUMENTS

| | | |
|---|---|---|
| 7,802,929 B2 * | 9/2010 | Moore et al. ................... 385/92 |
| 2003/0161108 A1 | 8/2003 | Bright et al. |
| 2003/0169581 A1 | 9/2003 | Bright et al. |
| 2003/0171016 A1 | 9/2003 | Bright et al. |
| 2003/0171033 A1 | 9/2003 | Bright et al. |

FOREIGN PATENT DOCUMENTS

| | | |
|---|---|---|
| JP | A-2005-520296 | 7/2005 |
| JP | A-2007-080560 | 3/2007 |

* cited by examiner

*Primary Examiner* — Uyen Chau N Le
*Assistant Examiner* — Michael Mooney
(74) *Attorney, Agent, or Firm* — Oliff PLC

(57) ABSTRACT

In a receptacle cage, a front EMI fingers in a tubular shape serving as a first shield member is provided on the entire periphery of a substantially rectangular module slot. In addition, a gap between outer peripheral surfaces of an upper case as well as a lower plate of an optical module connected to a receptacle connector in a receptacle connector accommodating portion and an inner surface of the cage is shielded by a top EMI fingers serving as a second shield member and side EMI fingers serving as third shield members. Moreover, the lower plate comes into contact with a bottom wall portion which is grounded.

12 Claims, 22 Drawing Sheets

RECEPTACLE CAGE, RECEPTACLE ASSEMBLY, AND TRANSCEIVER MODULE ASSEMBLY

CROSS-REFERENCES TO THE RELATED APPLICATIONS

This application claims the benefit of Japanese Patent Application No. 2011-188604 filed Aug. 31, 2011, which is hereby incorporated by reference herein in its entirety.

BACKGROUND OF THE INVENTION

1. Field of the Invention

The present invention relates to a receptacle cage, a receptacle assembly, and a transceiver module assembly.

2. Description of the Related Art

In an optical communication system, a transceiver module has been put into practical use in order to transmit an optical signal transmitted through an optical connector and the like to a mother board. As disclosed in Japanese Patent Laid-Open No. 2005-520296, for example, such a transceiver module is located on a chassis which constitutes a communication system. The transceiver module comprises the following constituents as main elements, namely, an optical module (which is referred to as a module assembly in Japanese Patent Laid-Open No. 2005-520296), and an optical module receptacle (which is referred to as a receptacle assembly in Japanese Patent Laid-Open No. 2005-520296) mounted on a circuit board serving as a mother board and configured to detachably accommodate the optical module.

An optical cable connector and an optical cable for establishing interconnection with another system, for example, are connected to a port at an end portion of the optical module exposed to a front cover of the chassis. When the optical module is connected to the optical module receptacle, a portion being connected of the optical module is connected to a connected portion of a receptacle connector mounted on a portion of the circuit board inside the optical module receptacle. The portion being connected of the receptacle connector is electrically connected to the above-mentioned circuit board. Hereby, the optical cable connector and the optical cable are electrically connected to the circuit board via the transceiver module.

Moreover, as disclosed in Japanese Patent Laid-Open No. 2005-520296, a looped EMI gasket collar and resilient metal spring gaskets are provided as a countermeasure for radio wave interference (electromagnetic interference, or EMI) in the periphery of a module insertion slot of the optical module receptacle in the transceiver module. In addition, multiple EMI gaskets are provided respectively on a front edge as well as two side edges of a lower opening, which is formed in the vicinity of the receptacle connector inside the optical module receptacle. Herewith, an EMI shield is formed at a junction between the receptacle connector and the optical module.

Further, as also disclosed in Japanese Patent Laid-Open No. 2005-520296, a measure for heat dissipation has been proposed that a heat sink may be provided on an upper surface of the optical module receptacle in the transceiver module.

In the above-described countermeasure for the radio wave interference, unnecessary radiation of noise from the inside of the transceiver module located in the chassis to the inside of the chassis is harmful to other electronic components on the circuit board as well. Accordingly, it is also required to inhibit such noise radiation into the chassis through a gap between an outer peripheral portion of the optical module and an inner peripheral portion of the optical module receptacle.

Japanese Patent Laid-Open No. 2005-520296 discloses a proposal of the configuration in which the multiple EMI gaskets are provided respectively on the front edge as well as the two side edges of the lower opening formed in the vicinity of the receptacle connector in the optical module receptacle.

However, a gap is formed between an upper surface portion at the outer peripheral portion of the optical module in the optical module receptacle and the inner peripheral portion of the optical module receptacle opposed to the upper surface portion. In particular, a given amount of a relative play in a direction of attaching or detaching the optical module is provided between the optical module and the optical module receptacle. Accordingly, it is not easy to tightly seal the gap between the outer peripheral portion of the optical module and the inner peripheral portion of the optical module receptacle. In short, the above-described configuration proposed in Japanese Patent Laid-Open No. 2005-520296 is likely to cause noise radiation through the gap and is therefore insufficient in light of the countermeasure for the radio wave interference.

SUMMARY OF THE INVENTION

In view of the above-described problem, the present invention aims to provide a receptacle cage, a receptacle assembly, and a transceiver module assembly. The receptacle cage, a receptacle assembly, and a transceiver module assembly can reliably suppress noise radiation from the inside to the outside of the receptacle cage.

A receptacle cage according to an aspect of the present invention is used in a receptacle assembly to be mounted on a wiring board in a housing of a communication system and includes: a module accommodating portion made of a metal and configured to detachably accommodate an optical module, the module accommodating portion having a module slot provided at one end to allow passage of the optical module, and a bottom wall portion coming in contact with a lower surface of the optical module; a connector accommodating portion made of a metal, the connector accommodating portion communicating with the module accommodating portion and accommodating a connector to which the optical module is connected; a first shield member made of a metal, the first shield member provided on an entire periphery of the module slot and configured to come into contact with an outer peripheral surface of the optical module and to shield electromagnetic noise generated in the module accommodating portion so as to avoid radiation of the noise into the housing; a second shield member made of a metal, the second shield member provided at an upper portion of the connector accommodating portion in a region corresponding to a boundary portion between the connector accommodating portion and the module accommodating portion, and configured to come into contact with an upper surface of the optical module and to shield the electromagnetic noise generated in the connector accommodating portion; and third shield members made of a metal, the third shield members provided in regions corresponding to the boundary portion between the connector accommodating portion and the module accommodating portion, the regions being different from a region where the second shield member is provided, the third shield members configured to come into contact with two side surfaces of the optical module and to shield the electromagnetic noise generated in the connector accommodating portion.

A receptacle assembly according to an aspect of the present invention is to be mounted on a wiring board in a housing of a communication system and comprises: a connector connected to an optical module; a receptacle cage including: a module accommodating portion made of a metal and configured to detachably accommodate the optical module, the module accommodating portion having a module slot provided at one end to allow passage of the optical module, and a bottom wall portion coming in contact with a lower surface of the optical module; a connector accommodating portion made of a metal, the connector accommodating portion communicating with the module accommodating portion and accommodating the connector; a first shield member made of a metal, the first shield member provided on an entire periphery of the module slot and configured to come into contact with an outer peripheral surface of the optical module and to shield electromagnetic noise generated in the module accommodating portion so as to avoid radiation of the noise into the housing; a second shield member made of a metal, the second shield member provided at an upper portion of the connector accommodating portion and configured to come into contact with an upper surface of the optical module and to shield the electromagnetic noise generated in the connector accommodating portion; and third shield members made of a metal, the third shield members provided in regions corresponding to a boundary portion between the connector accommodating portion and the module accommodating portion, the regions being different from a region where the second shield member is provided, third shield members configured to come into contact with two side surfaces of the optical module and to shield the electromagnetic noise generated in the connector accommodating portion; and a connector cover provided on the connector accommodating portion and configured to cover the connector.

A transceiver module assembly according to an aspect of the present invention is to be mounted on a wiring board in a housing of a communication system and comprises: an optical module; a connector connected to the optical module; and an optical module receptacle assembly including: a module accommodating portion configured to detachably accommodate the optical module, the module accommodating portion having a module slot provided at one end to allow passage of the optical module; a connector accommodating portion made of a metal, the connector accommodating portion communicating with the module accommodating portion and accommodating the connector; a first shield member made of a metal, the first shield member provided on an entire periphery of the module slot and configured to come into contact with an outer peripheral surface of the optical module and to shield electromagnetic noise generated in the module accommodating portion so as to avoid radiation of the noise into the housing; a second shield member made of a metal, the second shield member provided at an upper portion of the connector accommodating portion, and configured to come into contact with an upper surface of the optical module and to shield the electromagnetic noise generated in the connector accommodating portion; and third shield members made of a metal, the third shield members provided in regions corresponding to a boundary portion between the connector accommodating portion and the module accommodating portion, the regions being different from a region where the second shield member is provided, the third shield members configured to come into contact with two side surfaces of the optical module and to shield the electromagnetic noise generated in the connector accommodating portion; and a connector cover provided on the connector accommodating portion and configured to cover the connector.

Each of the receptacle cage, the receptacle assembly, and the transceiver module assembly according to the present invention comprises: the first shield member made of a metal, provided on the entire periphery of the module slot, and configured to come into contact with the outer peripheral surface of the optical module and to shield the electromagnetic noise generated in the optical module accommodating portion so as to avoid radiation of the noise into the housing; the second shield member made of a metal, provided at the upper portion of the connector accommodating portion, and configured to come into contact with the upper surface of the optical module and to shield the electromagnetic noise generated in the connector accommodating portion; and the third shield members made of a metal, provided in the regions corresponding to the boundary portion between the connector accommodating portion and the optical module accommodating portion, the regions being different from the region where the second shield member is provided, and configured to come into contact with the two side surfaces of the optical module and to shield the electromagnetic noise generated in the connector accommodating portion. Therefore, the receptacle cage, the receptacle assembly, and the transceiver module assembly can reliably suppress noise radiation from the inside to the outside of the optical module receptacle.

Further features of the present invention will become apparent from the following description of exemplary embodiments with reference to the attached drawings.

DESCRIPTION OF THE EMBODIMENTS

Figure 2:
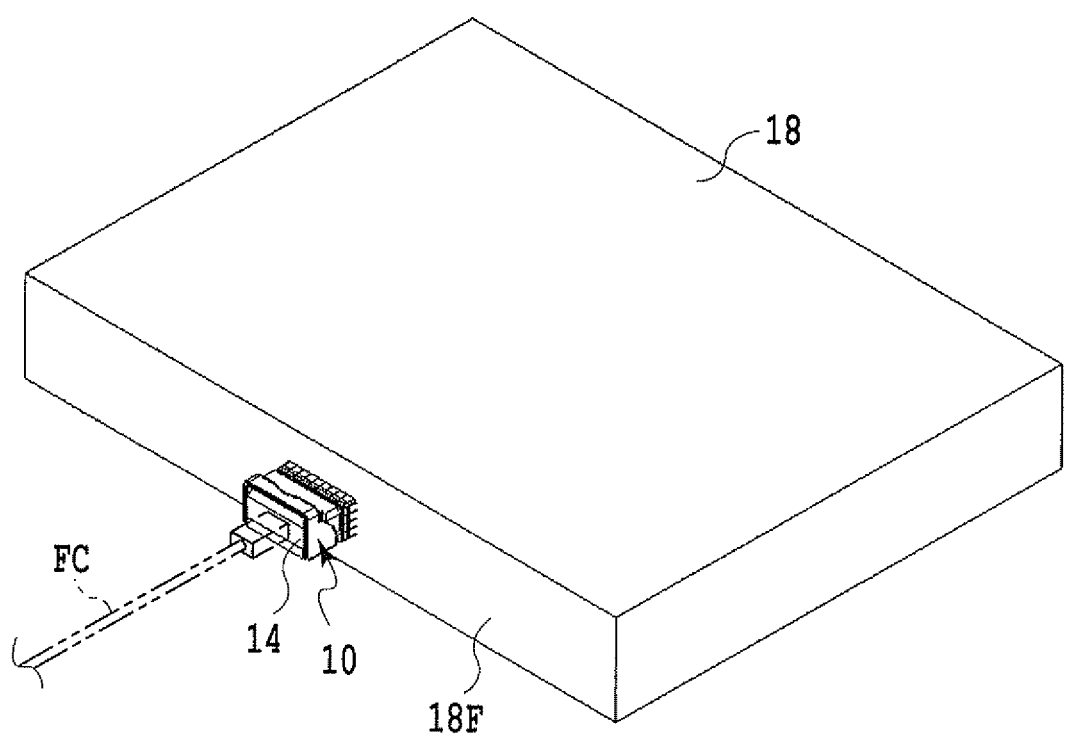
FIG. 2 is a perspective view schematically showing external appearance of a case which mounts an example of a transceiver module assembly according to the present invention.

FIG. 2 shows an example of a transceiver module assembly according to the present invention together with a housing 18 for embedding the assembly.

An end portion of an optical module 14 of a transceiver module assembly 10 to be described later protrudes out of an operating side end surface 18F of the housing 18. An optical connector, to which one end of an optical cable FC is connected, is connected to a port provided at the end portion of the optical module 14. Another end of the optical cable FC is connected to an optical connector of another housing which constitutes an unillustrated communication system.

Figure 3:
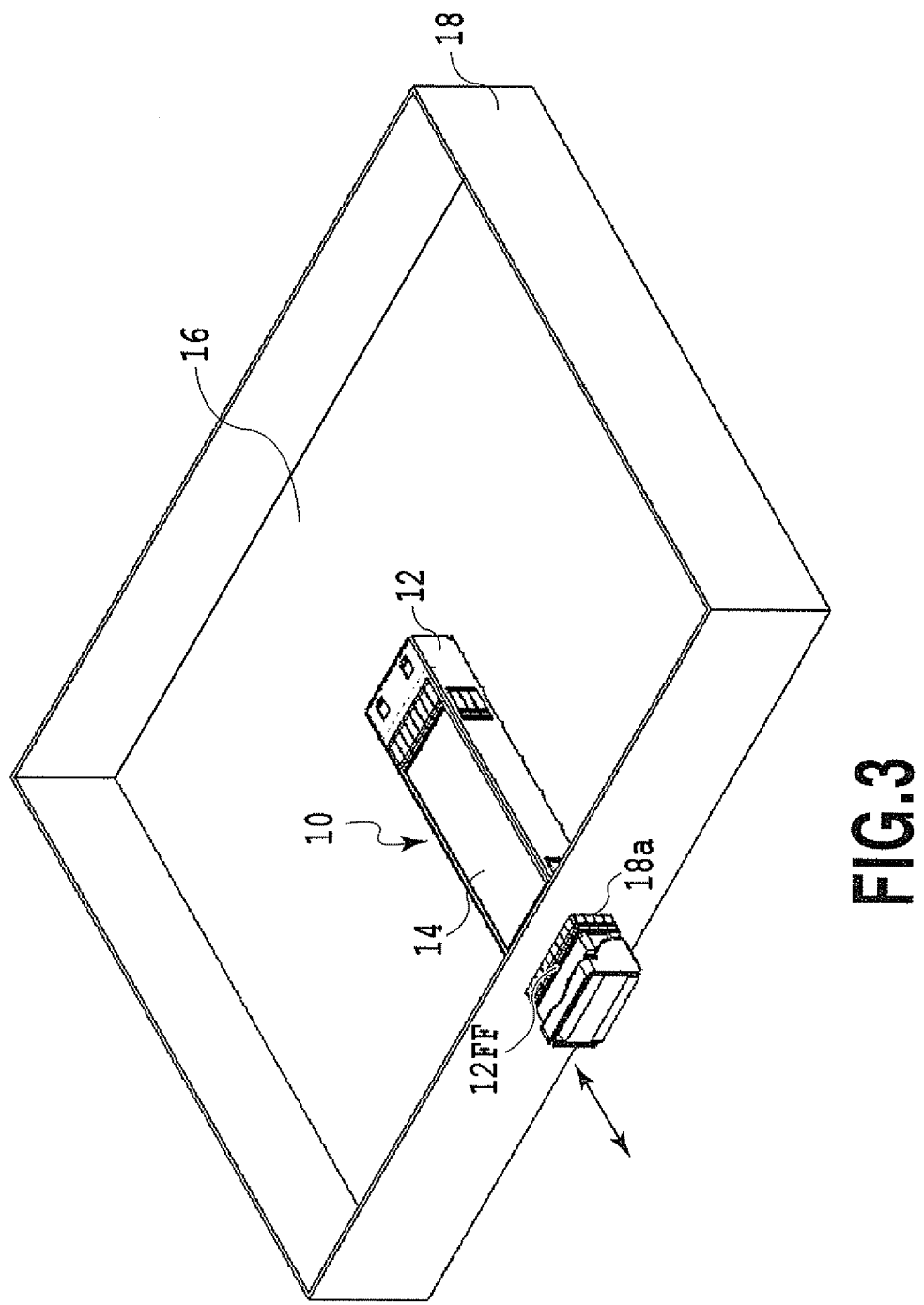
FIG. 3 is a perspective view illustrating an internal configuration of the housing in the example shown in FIG. 2.

As shown in FIG. 3, the housing 18 configured to define an enclosed space inside contains a printed wiring board 16 on which the transceiver module assembly 10 is mounted. In FIG. 3, one transceiver module assembly 10 is mounted on one printed wiring board 16. However, the present invention is not limited only to this configuration and multiple transceiver module assemblies 10 may be mounted on one printed wiring board 16.

An opening 18a is formed on the operating side end surface 18F of the housing 18. A front EMI fingers 12FF, which is made of a metal and provided at an end portion on a module slot side of the a receptacle cage 12 to be described later, is inserted into the opening 18a.

The transceiver module assembly 10 includes the optical module 14 and an optical module receptacle assembly.

Figure 5:
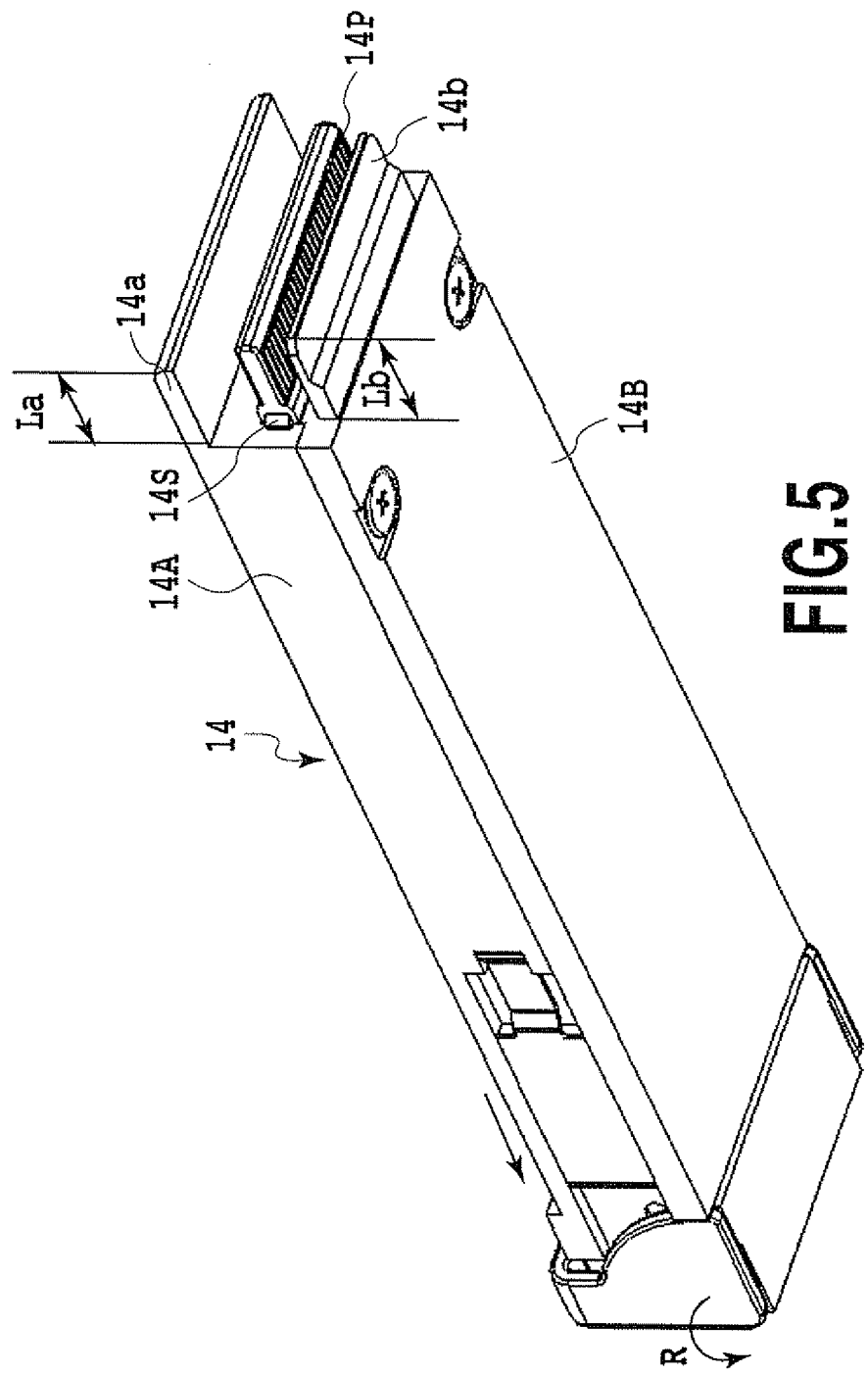
FIG. 5 is a perspective view showing external appearance of the optical module.

As shown in FIG. 5, the optical module 14 includes the following constituents as main elements, namely, an upper case 14A and a lower plate 14B being made of a metal and constituting a profile portion, and a module board 14S to be located at a predetermined position in a housing space defined between the upper case 14A and the lower plate 14B.

A protection wall 14a in a thin plate shape is formed on one end portion of the upper case 14A in such a manner as to be continuous with an upper surface of the upper case 14A and to protrude in a longitudinal direction. The protection wall 14a and a protection wall 14b to be described later are intended to protect a plug connector 14P to be described later in the event that the optical module 14 is dropped by mistake. A latch mechanism is provided at another end portion of the upper case 14A. The latch mechanism includes a release plate and a latch lever. When the latch lever is rotatably moved in a direction indicated with an arrow H in FIG. 5, i.e., counterclockwise, to a virtual plane shared with a lower surface of the lower plate 14B, a fixing piece of a release plate moves in the direction indicated with an arrow to be detached from a locking piece 12LF to be described later and the fixing piece of a release plate is set to an unlocked state. In addition, when the latch lever is rotatably moved in a direction opposite to the direction indicated with the arrow H in FIG. 5, the fixing piece of the release plate is fixed on the locking piece 12LF of a receptacle cage 12 to be described later. Herewith, the optical module 14 is set to a locked state with respect to the receptacle cage 12.

Figure 6A:
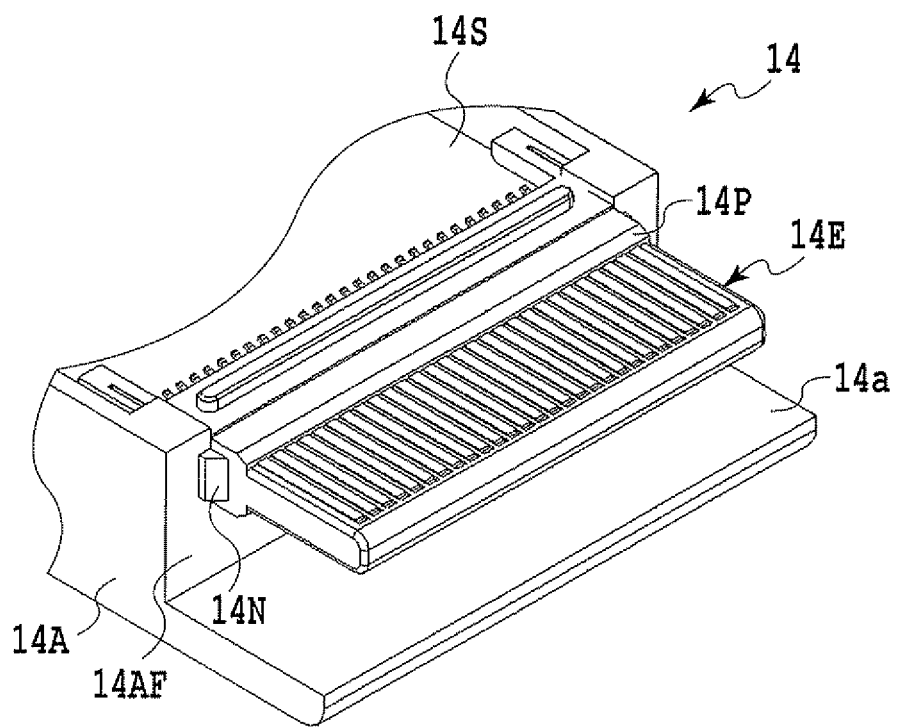
FIG. 6A is a perspective view illustrating a partial enlarged portion of the optical module shown in FIG. 5 in a state where a lower plate is detached therefrom.
Figure 6B:
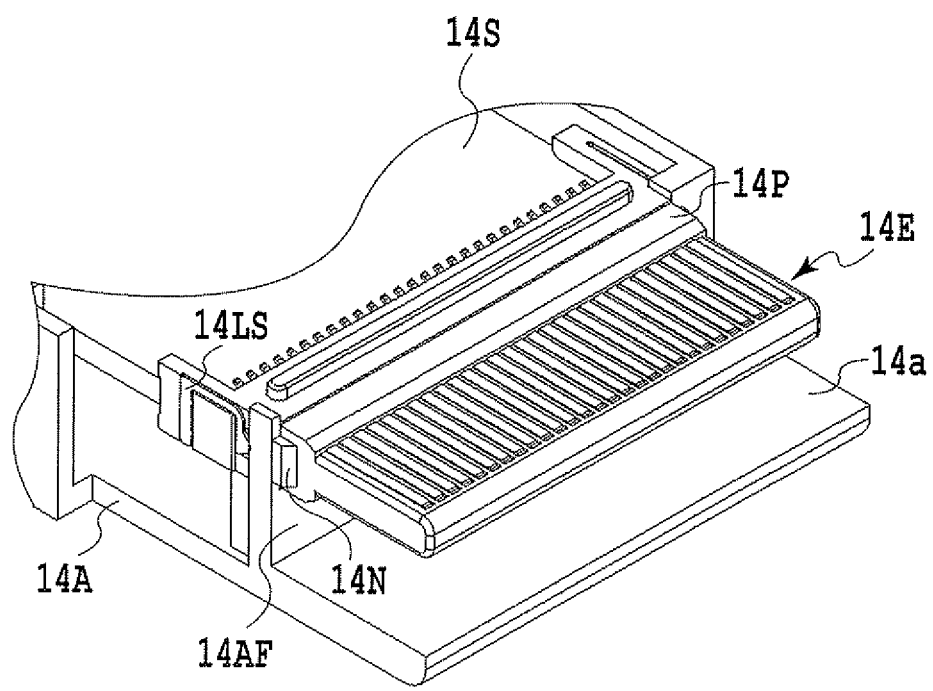
FIG. 6B is a perspective view illustrating a partially broken away portion of the optical module shown in FIG. 6A.
Figure 6C:
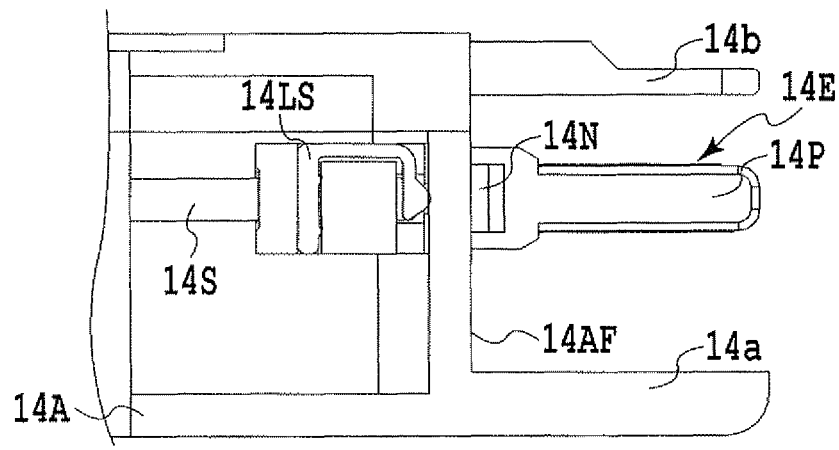
FIG. 6C is a partial cross-sectional view of a portion of the optical module shown in FIG. 6B.

As enlarged in FIG. 6A, an electrode portion 14E which constitutes the plug connector 14P is provided on one end portion of the module board 14S. Contact pads are arranged parallel to one another at given intervals on a common plane on each of front and back surfaces of the electrode portion 14E. As shown in FIG. 6A, a pair of nibs 14N are respectively formed near both side surfaces of the electrode portion 14E of the module board 14S. Each nib 14N is fixed on a peripheral edge of a groove on a board support wall 14AF of the upper case 14A. As shown in FIG. 6C, the module board 14S is inserted to the grooves such that the electrode portion 14E of the module board 14S is set substantially parallel to the protection wall 14a. As enlarged in FIG. 6B and FIG. 6C, leaf springs 14LS are provided in such a manner as to face the respective nibs 14N while interposing the board support wall 14AF therebetween. The pair of nibs 14N are securely fixed on the board support wall 14AF because of pressing the board support wall 14AF by the respective leaf springs 14LS. Thus, a play between the module board 14S and the upper case 14A is eliminated. As a consequence, a projection length from an end surface of the board support wall 14AF to a tip of the plug connector 14P is accurately controlled.

Figure 15:
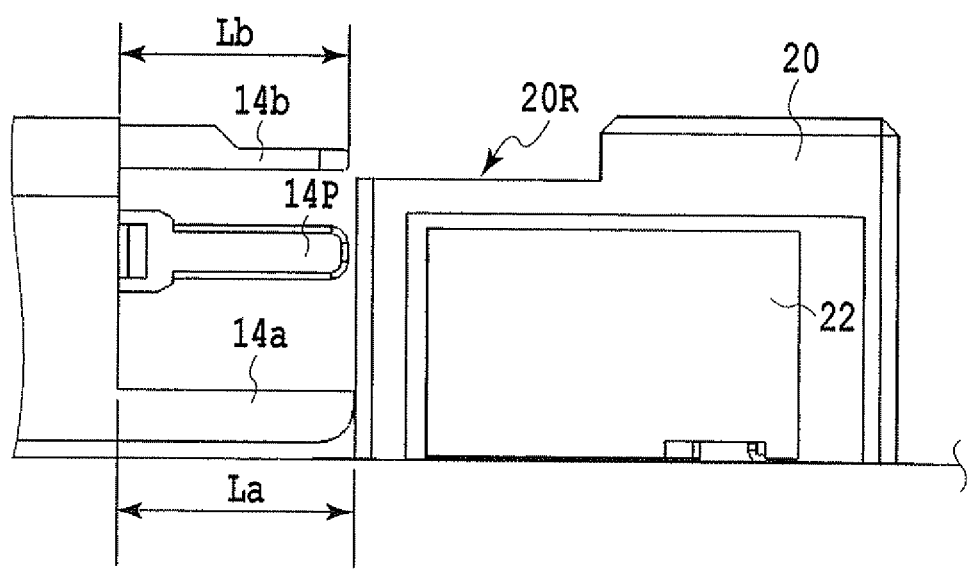
FIG. 15 is a side view of the example shown in FIG. 14.

As shown in FIG. 5, the protection wall 14b in a thin plate shape is formed on one end portion of the lower plate 14B in such a manner as to be continuous with a lower surface of the lower plate 14B and to protrude in the longitudinal direction. As shown in FIG. 6C, the protection wall 14b is formed substantially parallel to the plug connector 14P and the protection wall 14a while defining given intervals respectively therewith. As shown in FIG. 15, a projection length La of the protection wall 14a is set slightly greater than a projection length Lb of the protection wall 14b and a projection length of the plug connector 14P.

Figure 1:
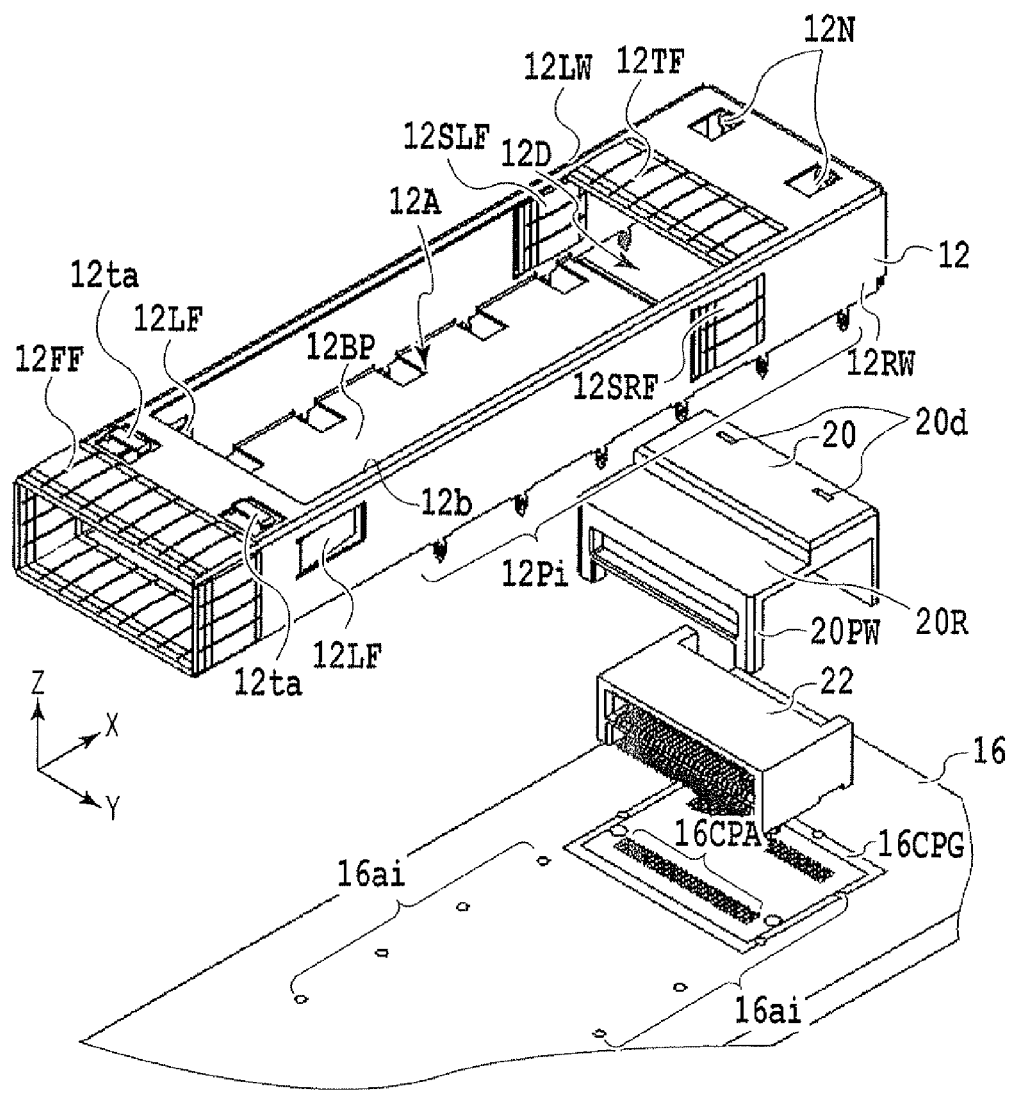
FIG. 1 is an exploded perspective view showing an example of a receptacle assembly according to the present invention.

As shown in FIG. 1, the optical module receptacle assembly includes the following constituents as main elements, namely, the receptacle cage 12 placed on the printed wiring board 16 and configured to detachably accommodate the above-described optical module 14, a receptacle connector 22 accommodated in a receptacle connector accommodating portion 12D of the receptacle cage 12, and a connector cover 20 covering the receptacle connector 22.

As shown in FIG. 1, for example, the receptacle cage 12 is formed by pressing a thin plate of stainless steel or phosphor bronze, or more preferably stainless steel having good thermal conductivity. The receptacle cage 12 is provided with a module accommodating portion 12A and the receptacle connector accommodating portion 12D therein.

The module accommodating portion 12A is defined by side walls 12RW and 12LW which face each other at a given interval, and by a bottom wall portion 12BP of the accommodating portion 12A. The side walls 12RW and 12LW extend in an X-coordinate axis direction in terms of a Cartesian coordinate system illustrated in FIG. 1, i.e., in a direction of mating and unmating the optical module 14. Each of the side walls 12RW and 12LW has the locking piece 12LF placed in the vicinity of a module slot to be described later. Each locking piece 12LF is selectively engaged with the fixing piece of the release plate of the optical module 14 described above so as to establish the locked state of the above-described optical module 14 with respect to the module accommodating portion 12A.

The module accommodating portion 12A has a module slot which is open in the X-coordinate axis direction at one end of the module accommodating portion. Herewith, the optical module 14 is mounted and demounted through the module slot. The tubular front EMI fingers 12FF serving as a first shield member is provided on the entire periphery of the module slot which has a substantially rectangular cross section. An inner peripheral portion of the front EMI fingers 12FF comes into contact with an outer peripheral portion of the optical module 14 to be inserted to the fingers 12FF. In addition, an outer peripheral portion of the front EMI fingers 12FF comes into contact with a peripheral edge of the opening 18a of the housing 18, for example. Hereby, when the receptacle cage 12 is press-fitted into the opening 18a of the housing 18 as shown in FIG. 3, a gap between the opening 18a of the housing 18 and the outer peripheral portion of the receptacle cage 12 is shielded by the front EMI fingers 12FF made of a metal. As a consequence, noise is confined in the housing 18, and there is no risk of leakage of the noise to the outside through the gap between the outer peripheral portion of the optical module 14 and the inner peripheral portion of the module accommodating portion 12A.

In addition, another end of the module accommodating portion 12A opposed to the module slot communicates with the inside of the receptacle connector accommodating portion 12D via a guide plate portion 20PW (see FIG. 4A) of the connector cover 20. As shown in FIG. 1, a substantially rectangular opening 12b that is open along a Z coordinate axis is formed at a portion opposed to the bottom wall portion 12BP. A pair of hooks 12ta configured to selectively hold a pair of fixing pieces (see FIG. 16) of a heat sink holder 32 to be described later are integrally formed with the receptacle cage 12 on a peripheral edge of the opening 12b. The pair of hooks 12ta are formed in a line in a Y-coordinate axis direction at a given interval corresponding to the interval of the pair of fixing pieces described above.

Figure 4A:
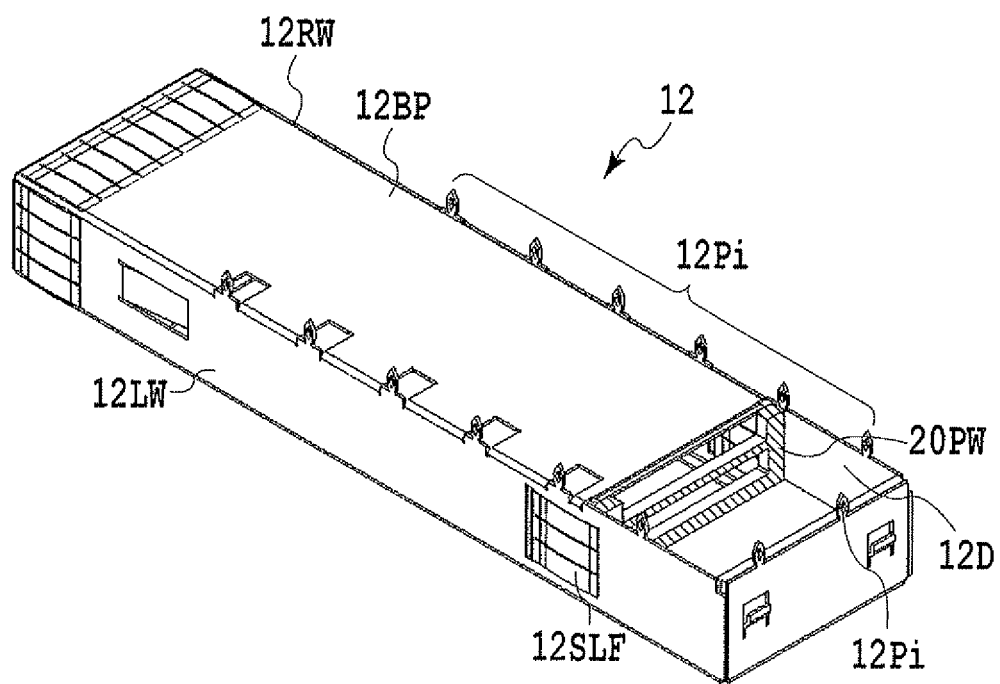
FIG. 4A is a perspective view showing an example of a receptacle cage according to the present invention.
Figure 12:
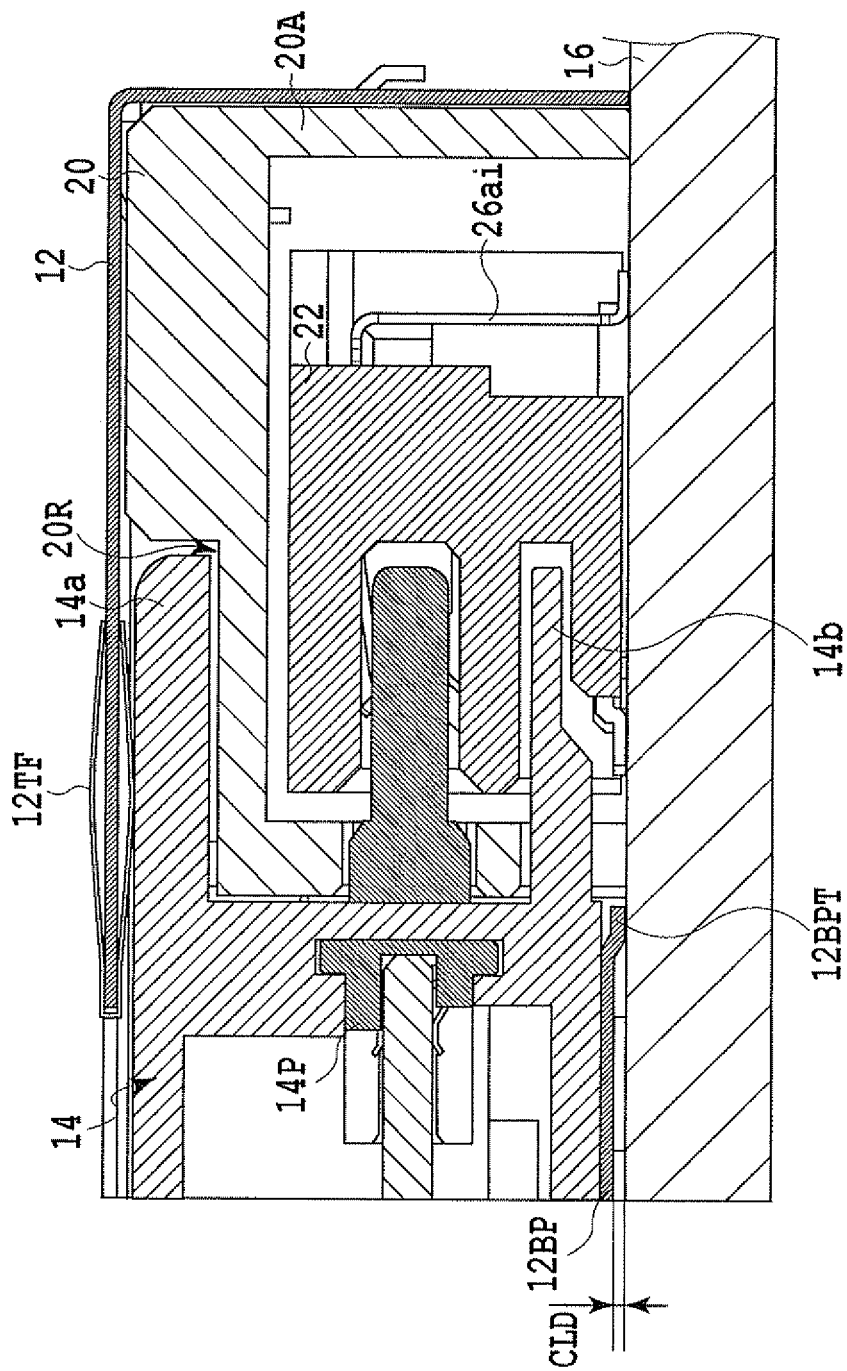
FIG. 12 is a cross-sectional view taken along the XII-XII line in FIG. 11.

As shown in FIG. 4A, both end portions on short sides of the bottom wall portion 12BP connecting lower ends of the side walls 12RW and 12LW are in contact with a surface of the printed wiring board 16. In addition, as enlarged in FIG. 12, one of the end portions on the short sides of the bottom wall portion 12BP is provided with a bend piece 12BPT. The bend piece 12BPT bent downward from the bottom wall portion 12BP comes into contact with a side of a looped ground contact pad 16CPG (see FIG. 1) formed on the surface of the printed wiring board 16. Herewith, the receptacle cage 12 is connected to ground. In addition, a portion of the wall surface portion 12BP excluding the above-mentioned end portion on the short side is provided with a given clearance (an air layer) CLD between the portion and the surface of the printed wiring board 16 by means of the bend piece 12BPT as shown in FIG. 12. Hereby, when the air inside the housing 18 flows through the clearance CLD with the assistance of a fan or the like, the bottom wall portion 12BP is cooled down by the air layer whereby heat generated in the optical module 14 is efficiently dissipated through the receptacle cage 12. Moreover, in light of the printed wiring board 16, the conductive pattern on the surface can also be formed at a region on the printed wiring board 16 located below a region of the bottom wall portion 12BP except the above-mentioned end portion on the short side of the bottom wall portion 12BP. As a consequence, design freedom of the conductive pattern is also increased.

As shown in FIG. 4A, press-fitting nibs 12Pi (i=1 to n, n is a positive integer) are formed at given intervals on both long sides of the bottom wall portion 12BP. As shown in FIG. 1, the press-fitting nibs 12Pi are respectively press-fitted into pores 16ai (i=1 to n, n is the positive integer) formed on the surface of the printed wiring board 16 corresponding to the array of the press-fitting nibs 12Pi. Hereby, a lower end surface of the receptacle cage 12 is cohered and fixed to the surface of the printed wiring board 16. In this case, as partially enlarged in FIG. 4B and FIG. 4C, lower end surfaces 12EM1, 12EM2, 12EM3, and 12EM4 on a portion forming the receptacle connector accommodating portion 12D in the receptacle cage 12 are cohered to the above-described ground contact pad 16CPG, thereby giving an EMI shield.

As enlarged in FIG. 4A, the receptacle connector accommodating portion 12D, which is open toward the surface of the printed wiring board 16, is defined by a receptacle connector-side closed end portion facing the module slot of the receptacle cage 12, an upper surface defining a peripheral edge of the opening 12b on the receptacle connector side, and receptacle connector-side portions of the side walls 12RW and 12LW.

Figure 11:
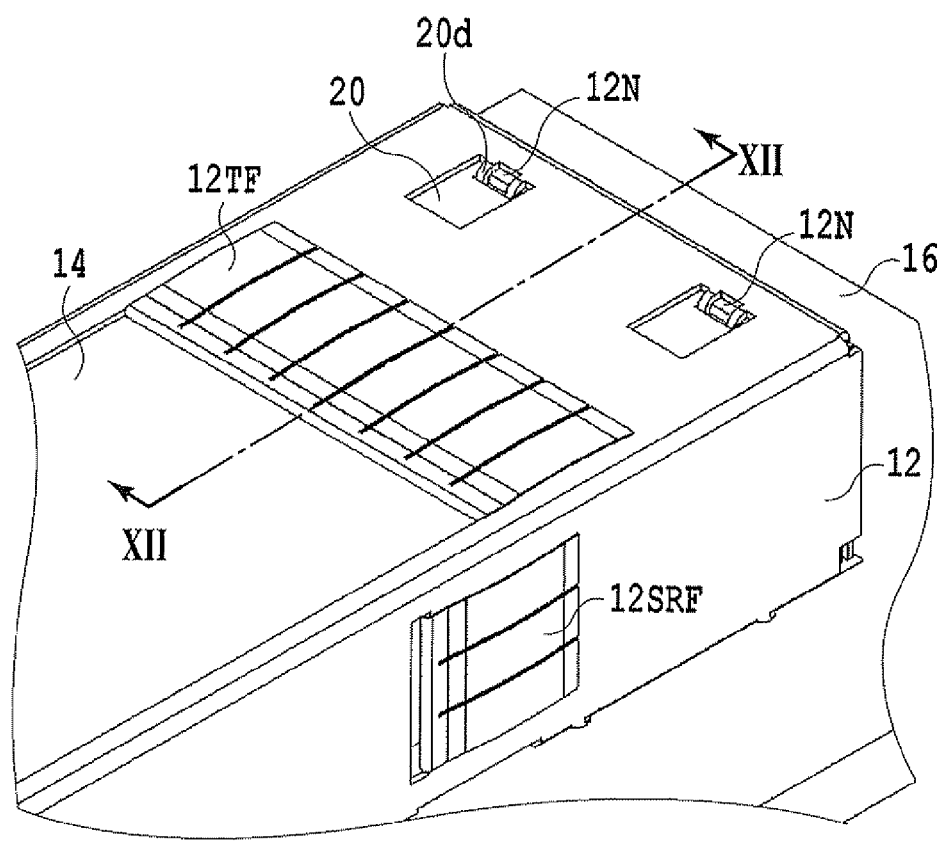
FIG. 11 is a partial enlarged perspective view of the transceiver module assembly shown in FIG. 2.

As shown in FIG. 1 and FIG. 11, a top EMI fingers 12TF made of a metal and serving as a second shield member is provided at a portion constituting an upper surface of the receptacle connector accommodating portion 12D. When the plug connector 14P of the optical module 14 is connected to the receptacle connector 22, the top EMI fingers 12TF is configured to come into contact with an outer peripheral surface of the protection wall 14a of the optical module 14 as enlarged in FIG. 12. In addition, as shown in FIG. 11, a pair of nibs 12N for holding the connector cover 20 to be described later are formed in positions closer to the receptacle connector-side closed end portion than the top EMI fingers 12TF.

Side EMI fingers 12SRF and 12SLF made of a metal and serving as third shield members are also provided respectively in positions on the side walls 12RW and 12LW facing the guide plate 20PW of the connector cover 20, namely, regions corresponding to a boundary portion between the receptacle connector accommodating portion 12D and the module accommodating portion 12A, for example. As shown in FIG. 1, the side EMI fingers 12SRF and 12SLF respectively straddle the receptacle connector accommodating portion 12D and the module accommodating portion 12A and extend in the longitudinal direction in such a manner to face each other. Accordingly, a position of one end portion of each side EMI fingers 12SRF or 12SLF is positioned closer to the module slot than the position of an end portion of the top EMI fingers 12TF.

Figure 4B:
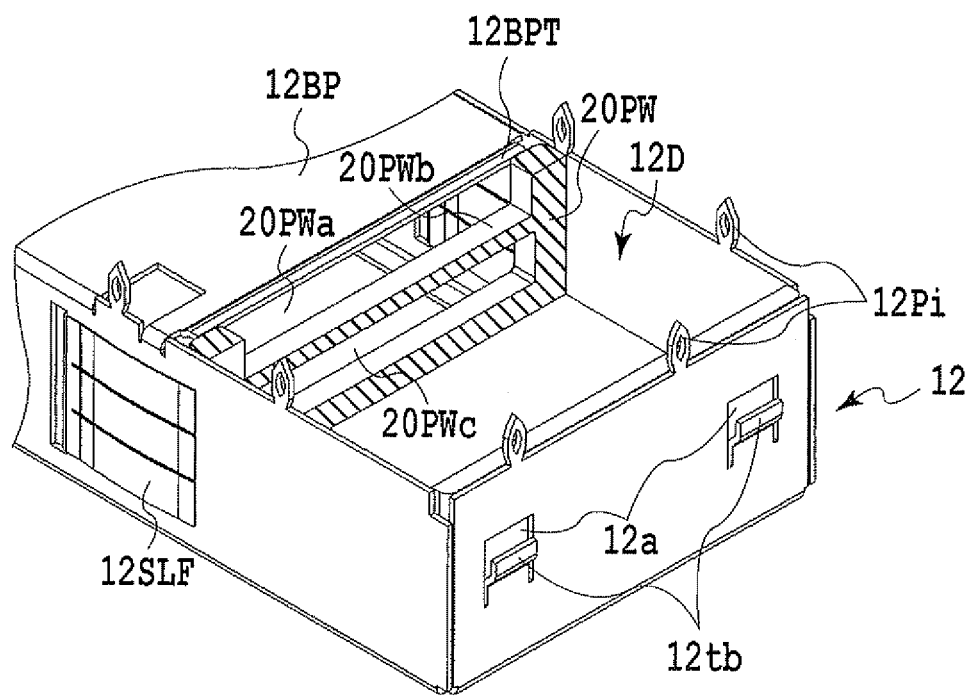
FIG. 4B is a perspective view illustrating a partial enlarged portion of the example shown in FIG. 4A.
Figure 4C:
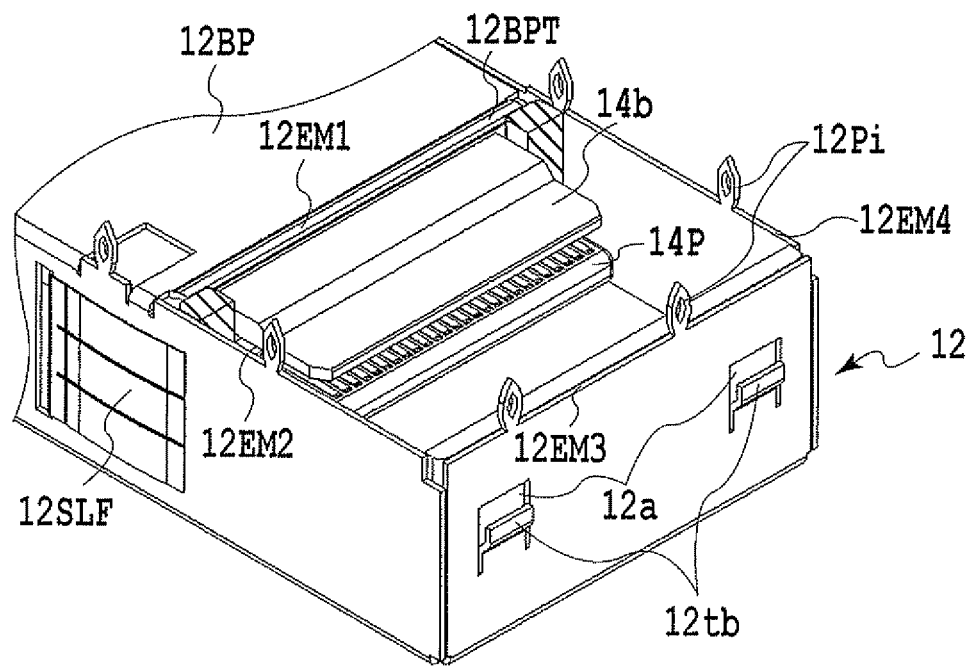
FIG. 4C is a perspective view illustrating a state of insertion of a plug connector of an optical module in the example shown in FIG. 4B.

In addition, when the plug connector 14P of the optical module 14 is connected to the receptacle connector 22, the side EMI fingers 12SRF and 12SLF respectively come into contact with side surfaces of the upper case 14A and the lower plate 14B of the optical module 14 which are opposed thereto as shown in FIG. 4C and FIG. 11.

Hereby, a gap between an inner peripheral surface of the receptacle cage 12 and outer peripheral surfaces of the upper case 14A and the lower plate 14B of the optical module 14 is shielded by the top EMI fingers 12TF as well as the side EMI fingers 12SRF and 12SLF and the lower plate 14B comes into contact with the bottom wall portion 12BP. Therefore, the generated noise is confined in the receptacle cage 12, and there is no risk of radiation of the noise to the housing 18 through the gap between the optical module 14 and the receptacle connector accommodating portion 12D.

As enlarged in FIG. 4B, a pair of hook members 12tb to be fixed with a pair of fixing pieces of the heat sink holder to be described later are formed integrally with the receptacle cage 12 at the receptacle connector side—closed end portion. An opening 12a is formed on a peripheral edge of each of the hook members 12tb.

The connector cover 20 is made of a metal material, for example. As shown in FIG. 1, the connector cover 20 includes the guide plate 20PW configured to guide the plug connector 14P of the optical module 14 when the optical module 14 is mounted and demounted, ands shield portion 20A (see FIG. 10) configured to accommodate the receptacle connector 22 inside and to cover the receptacle connector 22 while defining a predetermined clearance.

As shown in FIG. 42, the guide plate 20PW includes a slot 20PWc into which the plug connector 14P of the optical module 14 is inserted, and a cutaway portion 20PWa into which the protection wall 14b of the optical module 14 is inserted. The slot 20PWc and the cutaway portion 20PWa are partitioned by a partition wall 20PWb. The guide plate 20PW is integrally formed with the connector cover 20 in such a manner as to intersect an upper surface portion (shield portion 20A) of the connector accommodating portion.

Figure 10:
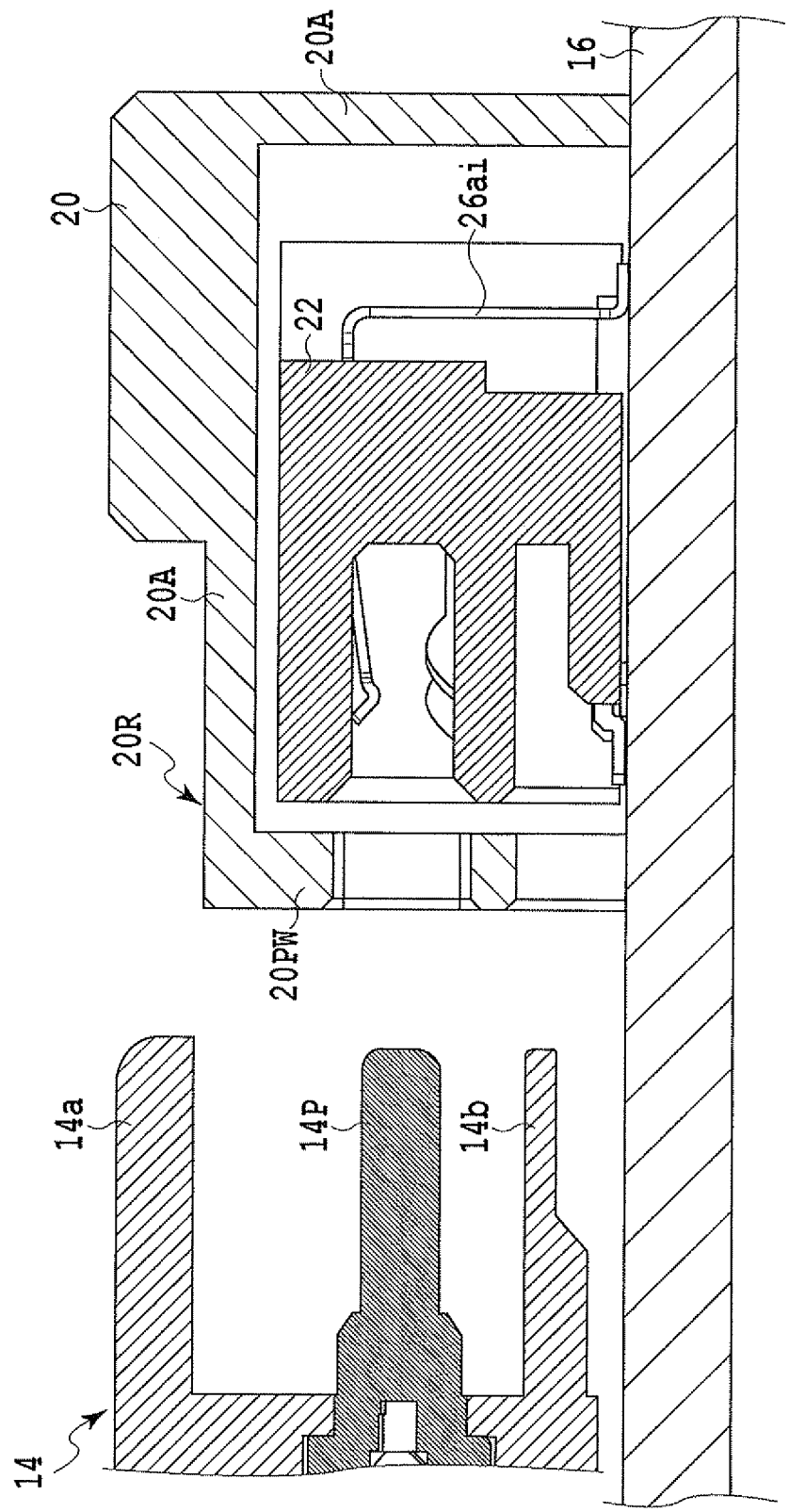
FIG. 10 is a cross-sectional view made available for explanation of an operation of the transceiver module assembly shown in FIG. 2.
Figure 14:
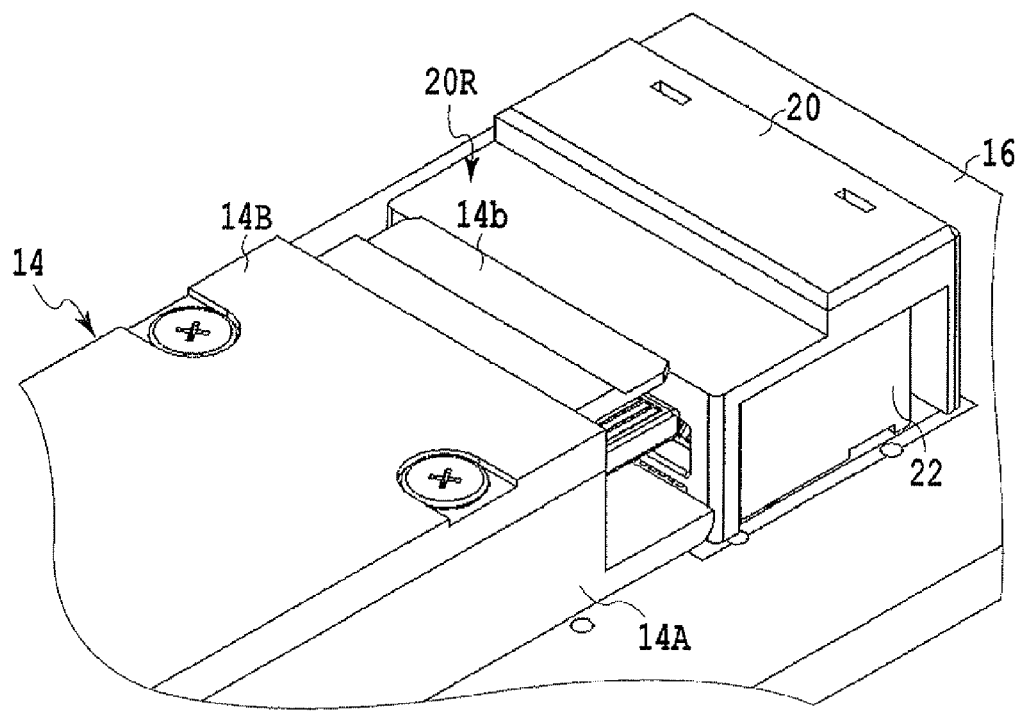
FIG. 14 is a cross-sectional view made available for explanation of upside-down insertion of the optical module into the transceiver module assembly shown in FIG. 2.

An upper surface portion of the shield portion 20A of the connector cover 20 is provided with a step portion 20R, which is configured to guide the protection wall 14a of the optical module 14 as shown in FIG. 10 and FIG. 12 upon mating and demating of the optical module 14. Herewith, when the optical module 14 is inserted upside down into the receptacle cage 12 by mistake as shown in FIG. 14 and FIG. 15, the tip of the protection wall 14a touches an end surface of the guide plate 20PW of the connector cover 20. Therefore, erroneous insertion of the optical module 14 is prevented. At that time, the tip of the protection wall 14a touches the end surface of the guide plate 20PW of the connector cover 20 whereas the tip of the plug connector 14P does not touch the end surface of the guide plate 20PW. Therefore, the tip of the plug connector 14P is prevented from breakage in case of erroneous insertion of the optical module 14.

In addition, holes 20d into which the pair of nibs 12N of the receptacle cage 12 are press-fitted are formed near the step portion 20R of the connector cover 20 (see FIG. 11).

Figure 7:
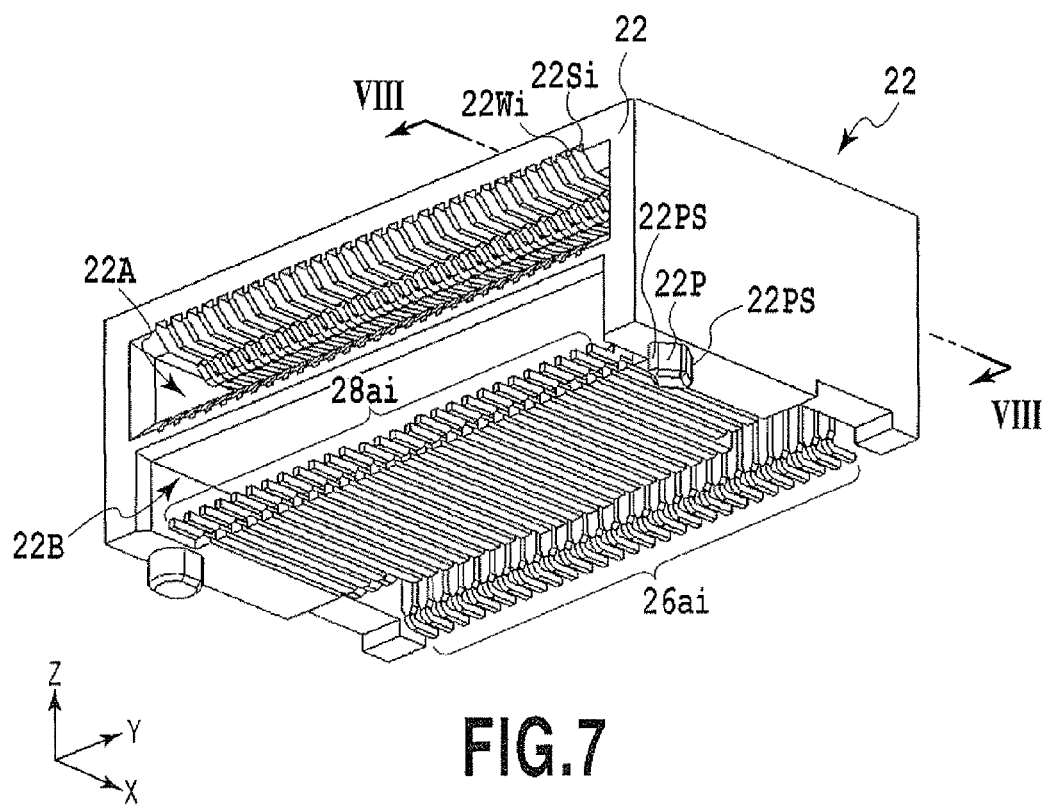
FIG. 7 is an enlarged perspective view illustrating a receptacle connector used in the example of the receptacle assembly shown in FIG. 1.
Figure 8:
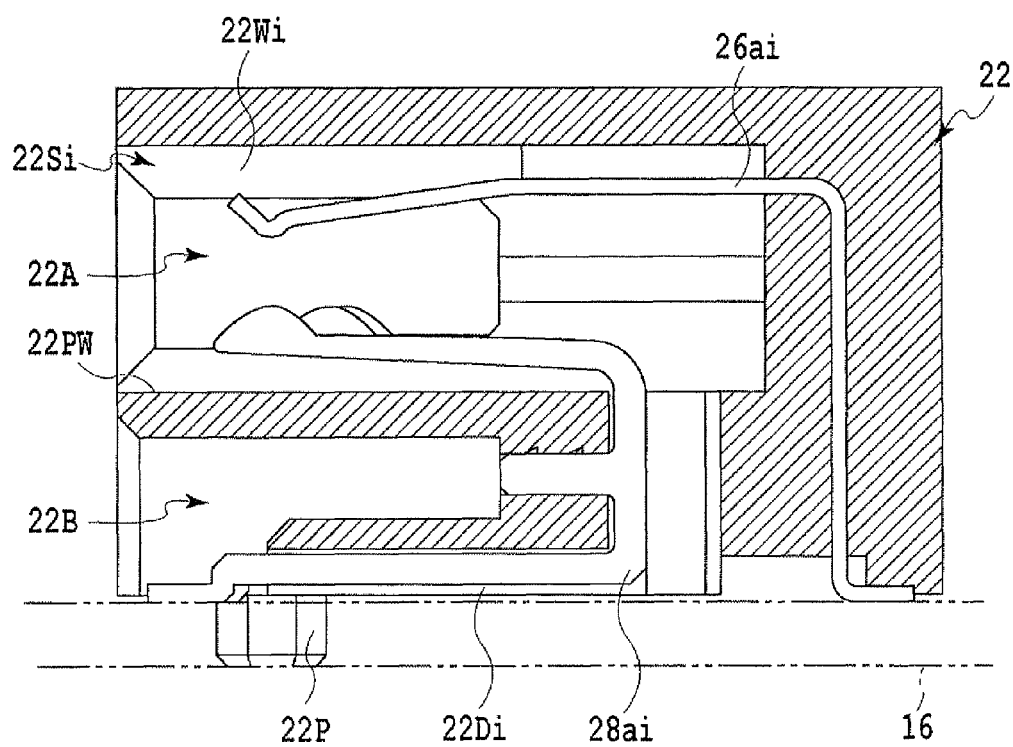
FIG. 8 is a cross-sectional view taken along the VIII-VIII line in FIG. 7.

As shown in FIG. 7 and FIG. 8, the receptacle connector 22 includes a connector insulator provided with a slot 22A which allows detachable insertion of the plug connector 14P of the optical module 14, and multiple contact terminals 26ai and 28ai (i=1 to n, n is a positive integer).

Figure 9A:
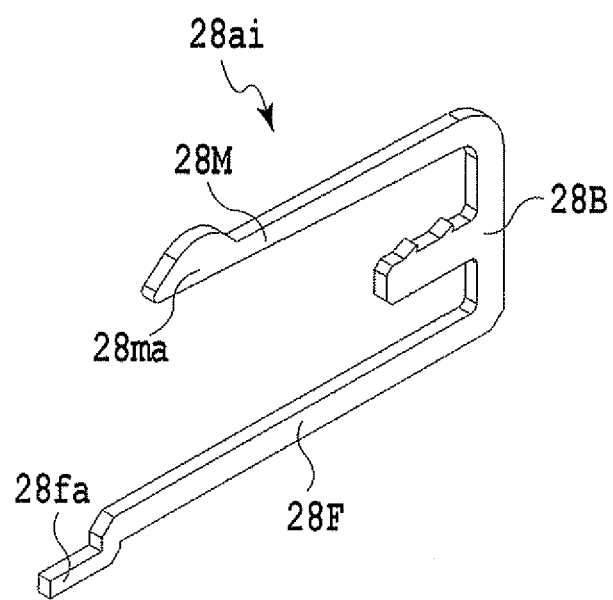
FIG. 9A is a perspective view illustrating a contact terminal used in the receptacle connector shown in FIG. 7.
Figure 9B:
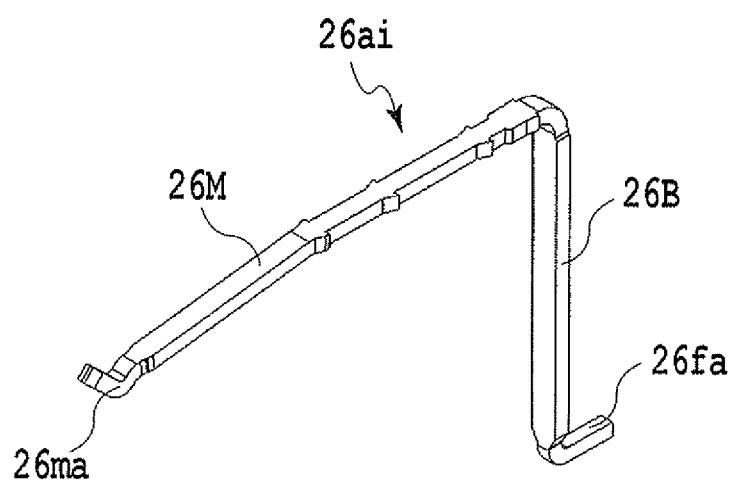
FIG. 9B is a perspective view illustrating another contact terminal used in the receptacle connector shown in FIG. 7.

The connector terminals 26ai and 28ai are configured to connect electrodes on the plug connector 14P of the optical connector 14 electrically to a group of electrodes 16CPA (see FIG. 1) which are connected to the conductive pattern on the printed wiring board 16. As shown in FIG. 9B, each contact terminal 26ai comprises a movable contact point portion 26M in which a contact point 26ma to come into contact with an electrode 14E on the plug connector 14P of the optical connector 14 is provided on one end, and a connection portion 26B in which a fixation terminal portion 26fa to be soldered to one of the group of electrodes 16CPA is provided on one end. The connection portion 26B is formed integrally with and perpendicularly to the other end of the movable contact point portion 26M. As shown in FIG. 9A, each contact terminal 28ai comprises a movable contact point portion 28M in which a contact point 28ma to come into contact with an electrode portion 14E on the plug connector 14P of the optical connector 14 is provided on one end, a fixation portion 28F in which a fixation terminal portion 28fa to be soldered to one of the group of electrodes 16CPA is provided on one end, and a connection portion 28B to connect the other end of the movable contact point portion 28M to the other end of the fixation portion 28F. The connection portion 28B is provided with a nib to be press-fitted and fixed to a wall portion which forms a slot 22B of the connector insulator.

As shown in FIG. 8, the connector insulator is molded by using a resin material. The connector insulator has the slot 22A where mounting and demounting of the plug connector 14P of the optical module 14 takes place, and the slot 22B where mounting and demounting of the protection wall 14b takes place. These slots are formed on two stages along the Z-coordinate axis. The slot 22B is formed below and substantially parallel to the slot 22A with a partition wall 22PW interposed therebetween.

The slot 22A is provided with a plurality of slits 22Si (i=1 to n, n is the positive integer) which are formed at given intervals along the Y-coordinate axis in FIG. 7. Each adjacent slits 22Si between them are partitioned by a partition wall 22Wi (i=1 to n, n is a positive integer). The movable contact point portion 26M of one of the contact terminals 26ai and the corresponding movable contact point portion 28M of the contact terminal 28ai are placed in each slit 22Si in such a manner as to face each other.

The slot 22B is provided with a plurality of slits 22Di (i=1 to n, n is the positive integer) which are formed at given intervals along the Y-coordinate axis in FIG. 7. Each adjacent slits 22Di between them are placed by a partition wall. As shown in FIG. 8, the fixation portion 28F of one of the contact terminals 28ai is located in each slit 22Di. Hereby, the fixation terminal portion 28fa of the contact terminal 28ai protrudes into the slot 22B. Accordingly, this configuration facilitates inspection and soldering operation at the time of maintenance.

Multiple positioning pins 22P to be fitted into positioning holes in the printed wiring board 16 are formed at a bottom portion of the connector insulator. Each positioning pin 22P has a pair of springs 22PS (see FIG. 7) configured to press and hold an inner peripheral portion of the corresponding positioning hole by applying pressure when the positioning pin 22P is fitted into the positioning hole in the printed wiring board 16.

Figure 13A:
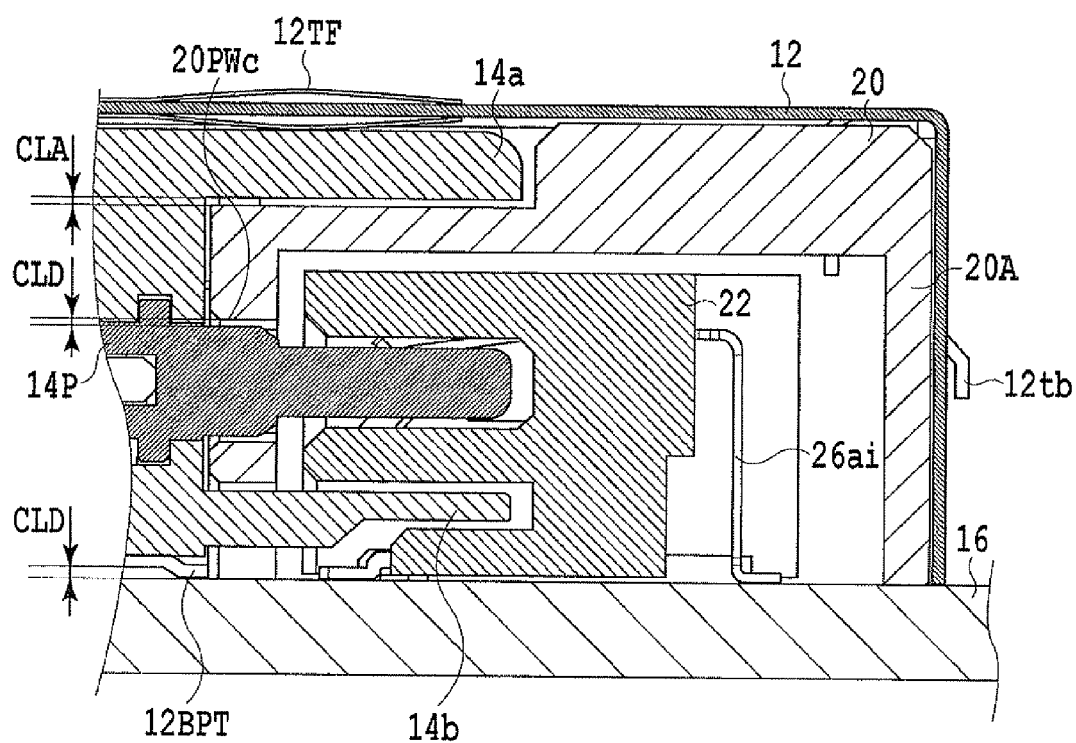
FIG. 13A is a cross-sectional view made available for explanation of an operation of the transceiver module assembly shown in FIG. 2.

In the above-described configuration, in a state where the plug connector 14P of the optical module 14 is connected to the contact terminals 26ai and 28ai inside the slot 22A of the receptacle connector 22 as shown in FIG. 13A, the protection wall 14a of the optical module 14 is biased toward the bottom wall portion 12BP by the top EMI fingers 12TF. At that time, a given clearance CLD is formed between a base end of the plug connector 14P of the optical module 14 and an inner peripheral surface of the slot 20PWc in the guide plate 20PW of the connector cover 20. In addition, a clearance CLA is formed between the protection wall 14a and the step portion 20R of the connector cover 20. Moreover, a given clearance larger than the clearance CLD is also formed between the plug connector 14P of the optical module 14 and an inner peripheral surface of the slot 22A of the receptacle connector 22. The clearance OLD is set smaller than the clearance CLA.

Figure 13B:
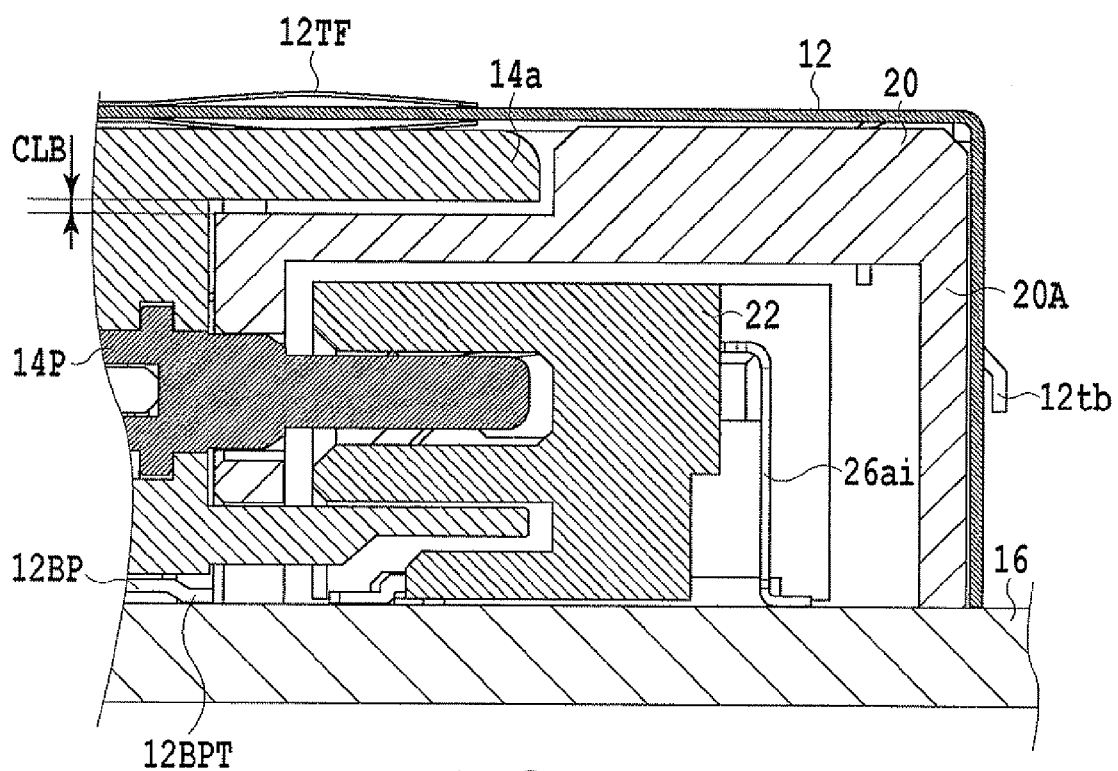
FIG. 13B is a cross-sectional view used for explanation of an operation of the transceiver module assembly shown in FIG. 2.

In the above-described circumstance, when an impact force in the direction of the Z-coordinate axis in FIG. 7 acts on the transceiver module assembly 10 and the printed wiring board 16 as shown in FIG. 13B whereby a clearance CLB between the protection wall 14a and the step portion 20R of the connector cover 20 becomes greater than the clearance CLA, the base end of the plug connector 14P comes into contact with the inner peripheral surface of the slot 20PWc in the guide plate 20PW of the connector cover 20. Accordingly, the plug connector 14P of the optical module 14 does not collide with the inner peripheral surface of the slot 22A of the receptacle connector 22. As a consequence, the plug connector 14P, the connector terminals 26ai, and the like are prevented from breakage.

Figure 16:
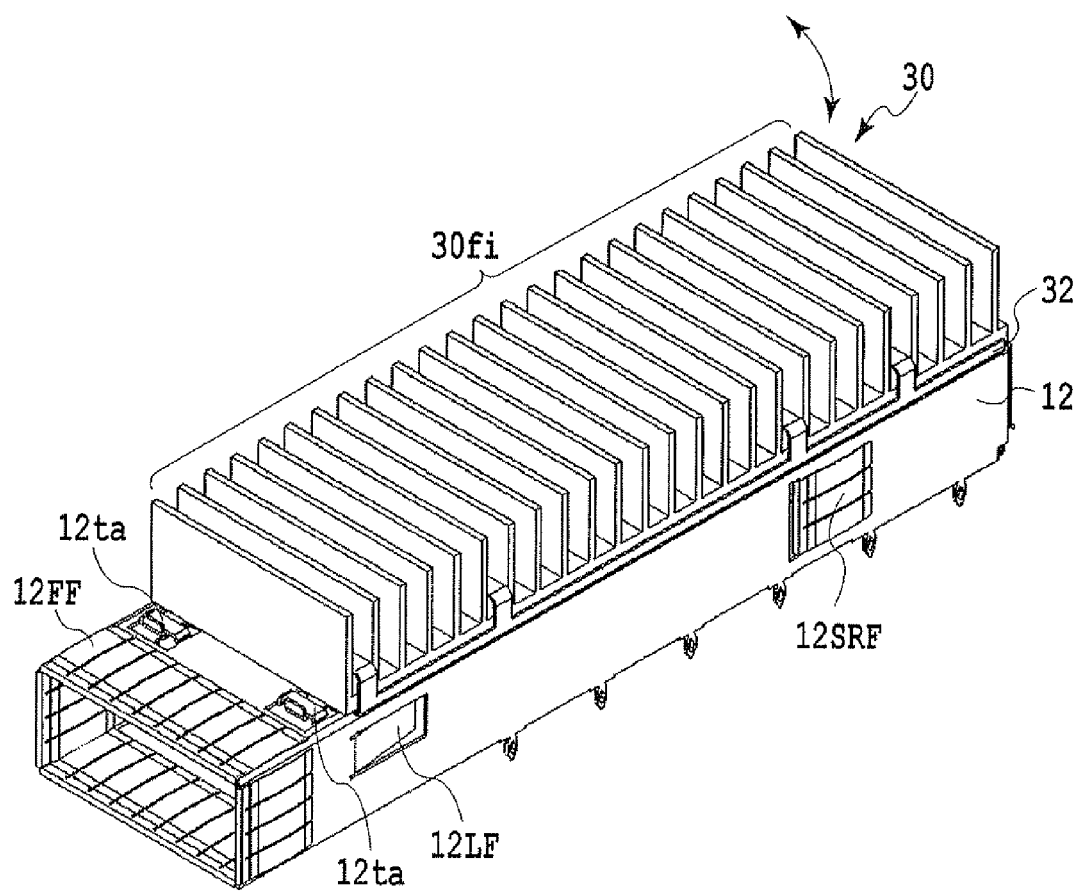
FIG. 16 is a perspective view illustrating a state where a heat sink is mounted on an upper part of the optical module receptacle assembly shown in FIG. 1.

As shown in FIG. 16, a heat sink 30 held by the heat sink holder 32 is detachably attached to an upper surface of the receptacle cage 12.

The heat sink holder 32 has the pair of fixing pieces provided on one end of the heat sink holder 32 and designed to be detachably fixed with the pair of hooks 12*ta* provided on the upper surface of the receptacle cage 12, and the pair of fixing pieces provided on the other end of the heat sink holder 32 and designed to be detachably fixed with the pair of hooks 12*tb* provided at the receptacle connector-side closed end portion of the receptacle cage 12. Herewith, the heat sink 30 can easily be attached to and detached from the receptacle cage 12 by rotatably moving the heat sink holder 32 together with the heat sink 30 pivotally around the hooks 12*ta* in directions indicated with arrows in FIG. 16.

The heat sink 30 is made of a metal having good thermal conductivity such as aluminum or the like. The heat sink 30 has fins 30*fi* (i=1 to n, n is a positive integer) which are arranged parallel to one another at given intervals in the X-coordinate axis direction.

In the above-described configuration, when the optical module 14 is mounted to the receptacle cage 12, a heat transfer surface (not shown) formed at a lower end of the heat sink 30 comes into direct contact with the outer peripheral surface of the upper case 14A of the optical module 14 via the opening 12*b*. Hereby, the heat generated in the optical module 19 is efficiently dissipated through the heat sink 30.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A receptacle cage used in a receptacle assembly to be mounted on a wiring board in a housing of a communication system, comprising:
    a module accommodating portion made of a metal and configured to detachably accommodate an optical module, the module accommodating portion having a module slot provided at one end to allow passage of the optical module, and a bottom wall portion coming in contact with a lower surface of the optical module;
    a connector accommodating portion made of a metal, the connector accommodating portion communicating with the module accommodating portion and accommodating a connector to which the optical module is connected;
    a first shield member made of a metal, the first shield member provided on an entire periphery of the module slot and configured to come into contact with an outer peripheral surface of the optical module and to shield electromagnetic noise generated in the module accommodating portion so as to avoid radiation of the noise into the housing;
    a second shield member made of a metal, the second shield member provided at an upper portion of the connector accommodating portion in a region corresponding to a boundary portion between the connector accommodating portion and the module accommodating portion, and configured to come into contact with an upper surface of the optical module and to shield the electromagnetic noise generated in the connector accommodating portion; and
    third shield members made of a metal, the third shield members provided in regions corresponding to the boundary portion between the connector accommodating portion and the module accommodating portion, the regions being different from a region where the second shield member is provided, the third shield members configured to come into contact with side surfaces of the optical module and to shield the electromagnetic noise generated in the connector accommodating portion.

2. The receptacle cage according to claim 1, wherein the connector accommodating portion has a connector cover made of metal and configured to shield the connector.

3. The receptacle cage according to claim 1, further comprising a bend piece provided at another end side of the bottom wall portion of at least the module accommodating portion, the bend piece configured to define a clearance between the module accommodating portion and the wiring board.

4. The receptacle cage according to claim 2, further comprising a bend piece provided at another end side of the bottom wall portion of at least the module accommodating portion, the bend piece configured to define a clearance between the module accommodating portion and the wiring board.

5. A receptacle assembly to be mounted on a wiring board in a housing of a communication system, comprising:
    a connector connected to an optical module;
    a receptacle cage including:
        a module accommodating portion made of a metal and configured to detachably accommodate the optical module, the module accommodating portion having a module slot provided at one end to allow passage of the optical module, and a bottom wall portion coming in contact with a lower surface of the optical module;
        a connector accommodating portion made of a metal, the connector accommodating portion communicating with the module accommodating portion and accommodating the connector;
        a first shield member made of a metal, the first shield member provided on an entire periphery of the module slot and configured to come into contact with an outer peripheral surface of the optical module and to shield electromagnetic noise generated in the module accommodating portion so as to avoid radiation of the noise into the housing;
        a second shield member made of a metal, the second shield member provided at an upper portion of the connector accommodating portion and configured to come into contact with an upper surface of the optical module and to shield the electromagnetic noise generated in the connector accommodating portion; and
        third shield members made of a metal, the third shield members provided in regions corresponding to a boundary portion between the connector accommodating portion and the module accommodating portion, the regions being different from a region where the second shield member is provided, third shield members configured to come into contact with side surfaces of the optical module and to shield the electromagnetic noise generated in the connector accommodating portion; and
    a connector cover provided on the connector accommodating portion and configured to cover the connector.

6. The receptacle assembly according to claim 5, wherein the connector accommodating portion has a connector cover made of metal and configured to shield the connector.

7. The receptacle assembly according to claim 5, further comprising a bend piece provided at another end side of the bottom wall portion of at least the module accommodating portion, the bend piece configured to define a clearance between the module accommodating portion and the wiring board.

8. The receptacle assembly according to claim 6, further comprising a bend piece provided at another end side of the bottom wall portion of at least the module accommodating portion, the bend piece configured to define a clearance between the module accommodating portion and the wiring board.

9. A transceiver module assembly to be mounted on a wiring board in a housing of a communication system, comprising:
- an optical module;
- a connector connected to the optical module; and
- an optical module receptacle assembly including:
  - a module accommodating portion configured to detachably accommodate the optical module, the module accommodating portion having a module slot provided at one end to allow passage of the optical module;
  - a connector accommodating portion made of a metal, the connector accommodating portion communicating with the module accommodating portion and accommodating the connector;
  - a first shield member made of a metal, the first shield member provided on an entire periphery of the module slot and configured to come into contact with an outer peripheral surface of the optical module and to shield electromagnetic noise generated in the module accommodating portion so as to avoid radiation of the noise into the housing;
  - a second shield member made of a metal, the second shield member provided at an upper portion of the connector accommodating portion, and configured to come into contact with an upper surface of the optical module and to shield the electromagnetic noise generated in the connector accommodating portion; and
  - third shield members made of a metal, the third shield members provided in regions corresponding to a boundary portion between the connector accommodating portion and the module accommodating portion, the regions being different from a region where the second shield member is provided, the third shield members configured to come into contact with side surfaces of the optical module and to shield the electromagnetic noise generated in the connector accommodating portion; and
  - a connector cover provided on the connector accommodating portion and configured to cover the connector.

10. The transceiver module assembly according to claim 9, wherein the connector accommodating portion has a connector cover made of metal and configured to shield the connector.

11. The transceiver module assembly according to claim 9, further comprising a bend piece provided at another end side of the bottom wall portion of at least the module accommodating portion, the bend piece configured to define a clearance between the module accommodating portion and the wiring board.

12. The transceiver module assembly according to claim 10, further comprising a bend piece provided at another end side of the bottom wall portion of at least the module accommodating portion, the bend piece configured to define a clearance between the module accommodating portion and the wiring board.

* * * * *